(12) United States Patent
Valette et al.

(10) Patent No.: US 9,783,142 B2
(45) Date of Patent: Oct. 10, 2017

(54) ELECTRIC CIRCUIT FOR CUTTING OFF AN ELECTRIC POWER SUPPLY HAVING TRANSISTORS AND FUSES

(71) Applicant: SAGEM DEFENSE SECURITE, Boulogne-Billancourt (FR)

(72) Inventors: Patrick Valette, Boulogne-Billancourt (FR); Francois Guillot, Boulogne-Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 507 days.

(21) Appl. No.: 14/409,461

(22) PCT Filed: Jun. 21, 2013

(86) PCT No.: PCT/EP2013/062990
§ 371 (c)(1),
(2) Date: Dec. 18, 2014

(87) PCT Pub. No.: WO2013/190087
PCT Pub. Date: Dec. 27, 2013

(65) Prior Publication Data
US 2015/0165989 A1    Jun. 18, 2015

(30) Foreign Application Priority Data

Jun. 21, 2012 (FR) .................................. 12 55871

(51) Int. Cl.
*B60R 16/03* (2006.01)
*H02H 3/05* (2006.01)
(Continued)

(52) U.S. Cl.
CPC ............ *B60R 16/03* (2013.01); *B60R 16/023* (2013.01); *H02H 3/05* (2013.01); *H03K 19/00315* (2013.01); *B64D 2221/00* (2013.01)

(58) Field of Classification Search
CPC ....................................................... H02H 3/05
(Continued)

(56) References Cited

U.S. PATENT DOCUMENTS

2015/0222108 A1* 8/2015 Valette ..................... H02J 1/08
307/115

FOREIGN PATENT DOCUMENTS

WO   WO 2008/113337 A2   9/2008
WO   WO 2011/107216 A1   9/2011

OTHER PUBLICATIONS

Written Opinion of the International Searching Authority issued for PCT/EP2013/062990 dated Dec. 23, 2014 with English translation (12 pages).

\* cited by examiner

*Primary Examiner* — Adi Amrany
(74) *Attorney, Agent, or Firm* — Blakely Sokoloff Taylor & Zafman LLP

(57) ABSTRACT

The invention relates to an electric circuit suitable for cutting off an electric power supply of an electrical device, said electric circuit receiving as input at least two discrete electrical signals, the values of which condition the power supply of the electrical device, the discrete electrical signals having a high state if the electrical device needs to be supplied: the electric circuit including a voltage source; a first cut-off unit connected between the electrical device and the voltage source, the first cut-off unit having an open or closed state in accordance with the discrete electrical signals; a second cut-off unit connected to the intersection between the electrical device and the first cut-off unit, and to an earth line, the second cut-off unit having a state that complements the first cut-off unit if the discrete electrical signals are in identical states, said first and second cut-off (Continued)

units being controlled such as to generate a short-circuit in the event of a divergence between the discrete electrical signals.

13 Claims, 4 Drawing Sheets

(51) Int. Cl.
    *H03K 19/003*     (2006.01)
    *B60R 16/023*     (2006.01)

(58) Field of Classification Search
    USPC .................................................. 307/115, 326
    See application file for complete search history.

ELECTRIC CIRCUIT FOR CUTTING OFF AN ELECTRIC POWER SUPPLY HAVING TRANSISTORS AND FUSES

GENERAL TECHNICAL FIELD

The invention relates to the security field for controlling systems or equipment, especially electronic ones and more particularly those on board of an aircraft.

STATE OF THE ART

An electrical system can be controlled once a condition is checked.

A known solution is to connect the power supply of the electric system to an electric circuit configured to test discrete signals indicating that a condition is true.

For example, in the case of an aircraft, some of electrical equipment should be cut-off in flight, such as, in the case of avionic data acquisition, processing and communication systems, the wireless transmission radio module has to be cut in order to avoid disturbing the aircraft functioning.

By means of logic gates AND connected to switches, it is possible to simply turn off the power of the radio module if necessary.

Such a solution is however not satisfactory when safety levels particularly high are required. For instance, the levels of reliability needed to supply electrical equipment presenting catastrophic risk, that is to say potentially leading to loss of human life, are around $10^{-9}$ per hour flight.

PRESENTATION OF THE INVENTION

The invention proposes to overcome at least one of these disadvantages.

For this purpose, the invention provides an electric circuit adapted to cut-off a power supply of an electric device, said circuit receiving as input at least two discrete electrical signals of which values determine the power supply of the electric device, the discrete electrical signals presenting a high state if the electric device is to be power supplied,
  the electric circuit comprises a voltage source;
  a first cut-off unit connected between the electric device and the voltage source, the first cut-off unit having an open or closed state depending on the discrete electrical signals;
  a second cut-off unit connected to the intersection between the electric device and the first cut-off unit, and a ground line, the second cut-off unit having a complementary state to the first cut-off unit if the discrete electrical signals are in a same state, the second cut-off unit comprises a parallel arrangement of at least two switches, the said parallel circuit being connected to the power source, the state of each of both switches is a function of a discrete electrical signal, the switches being in the same state when the discrete electrical signals are in the same state, the said first and second cut-off units being controlled to generate a short-circuit in case of divergence between the discrete electrical signals, at least two switches of the second cut-off unit having divergent states one from another so as to generate the said short-circuit.

The invention is advantageously completed by the following characteristics, taken alone or in any technically possible combination:
  the second cut-off unit comprises a parallel arrangement of at least two switches, the parallel arrangement being connected to the power source, the state of each of the two switches is a function of a discrete electrical signal, the second cut-off unit comprising as many switches as discrete electrical signals;
  the switches of the parallel connection have an open or closed state depending on an electric control signal, the switches being in the open state if the electric control signal has a "high" state and in the closed state if the electric control signal has a "low" state;
  the first cut-off unit comprises a first switch having an open or closed state depending on an electric control signal based on discrete electrical signals, the first switch is in the open state if the electric control signal has a "low" state and is in the closed state if the electric control signal has a "high" state;
  the first switch is controlled by a logical function of discrete signals of the type OR logic;
  the first cut-off unit comprises a second switch, this second switch having an open or closed state depending on an electric control signal based on discrete electrical signals, the second switch being in the open state if the electric control signal has a "down" state and is in the closed state if the electric control signal has a "high" state, the said second switch being suitable to isolate the voltage source of the electric power supply if the discrete electrical signals are on the low state;
  the second switch is controlled by a logical function of discrete electrical signals of the type 'AND' logic;
  it comprises at least one fuse to isolate, in case of short-circuit, the voltage source of elements of the said electric circuit;
  it includes a test unit for detecting a failure of at least one circuit component and optionally controlling the first and second switching units to generate a short-circuit;
  the test unit is adapted to implement the steps of: isolating the electrical equipment of the electric circuit; controlling the second cut-off unit so as to have this latter in the closed state; measuring a voltage between the first cut-off unit and the second cut-off unit in order to check that the second cut-off unit is adapted to generate a short-circuit;
  the test unit is adapted to implement the steps of: controlling the first cut-off unit so that this latter is in the closed state; measuring a voltage at the terminals of the second cut-off unit, a voltage equal to the voltage supplied by the voltage source indicating that the first cut-off unit is operating; controlling the first cut-off unit so that the latter is in the open state; measuring a voltage at the terminals of the second cut-off unit, a zero voltage indicating that the first cut-off unit is operating;
  the test unit is implemented by means of programmable logic components or by means of microcontrollers which can incorporate means of analog voltage measurements to enhance the circuit supervision level.

And the invention also relates to an avionic data acquisition, processing and communication system comprising a radio module connected to an electric circuit according to the invention.

The circuit of the invention comprising several components, the safety level of circuit is in the order of $10^{-9}$. Furthermore, by using several stages that may interact according to their state ensures that the system is robust to failures that may affect components while enabling to supply the electrical equipment only in the case it should be.

Thus, we obtain a circuit which can destruct itself in the event of failure of the components.

The reached reliability level is such that it is not necessary to monitor preventively the good functioning of the circuit because the level of redundancy is such that it is statistically impossible that the whole failures resulting in power setting of electrical equipment, unwanted, can occur over a period of thirty years and more.

PRESENTATION OF FIGURES

Other features, aims and advantages of the invention will appear from the following description, which is purely illustrative and non-limiting and should be read with reference to the appended drawings in which.

Among all these figures, the similar elements share identical references.

DETAILED DESCRIPTION OF THE INVENTION

Figure 1:
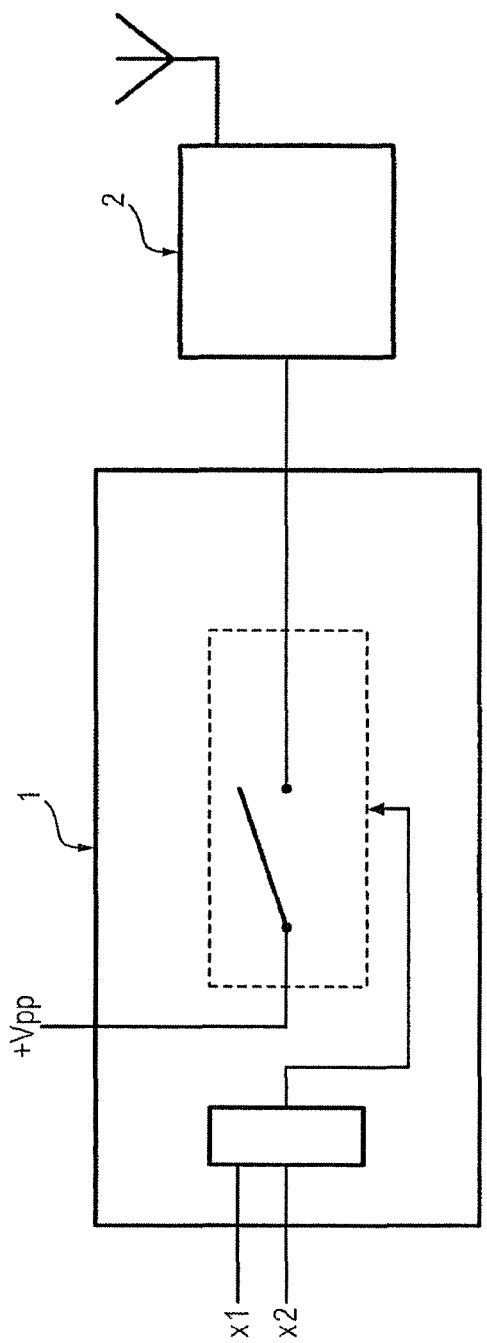
FIG. 1 illustrates an avionic data acquisition, processing and communication system in accordance with an embodiment of the invention.

In relation to FIG. 1, an avionic data acquisition, processing and communication system includes:
 an acquisition unit (not represented) of discrete electrical signals $x1$, $x2$ indicating a state of the aircraft;
 a radio module 2 adapted to transfer the avionic data of the system towards a remote station;
 a voltage power source +Vpp of the radio module 2, and
 a power electric circuit 1 of the radio module 2 which enables cutting off the power of the radio module when the aircraft is in flight.

A state of the aircraft is, for instance, in flight, on the ground, etc. When the aircraft is on the ground, the discrete electrical signals indicating that the aircraft has landed, are for example: a signal indicating the existence of a weight of the aircraft on the wheels, or a signal indicating that the doors of the aircraft are open.

The power electric circuit can be modeled by a switch controlled by a logical function of discrete electrical signals (see FIG. 1).

By logical function, we mean a series of operations related to one or more variables. The known logic functions are: AND, OR, XOR, etc.

Figure 2:
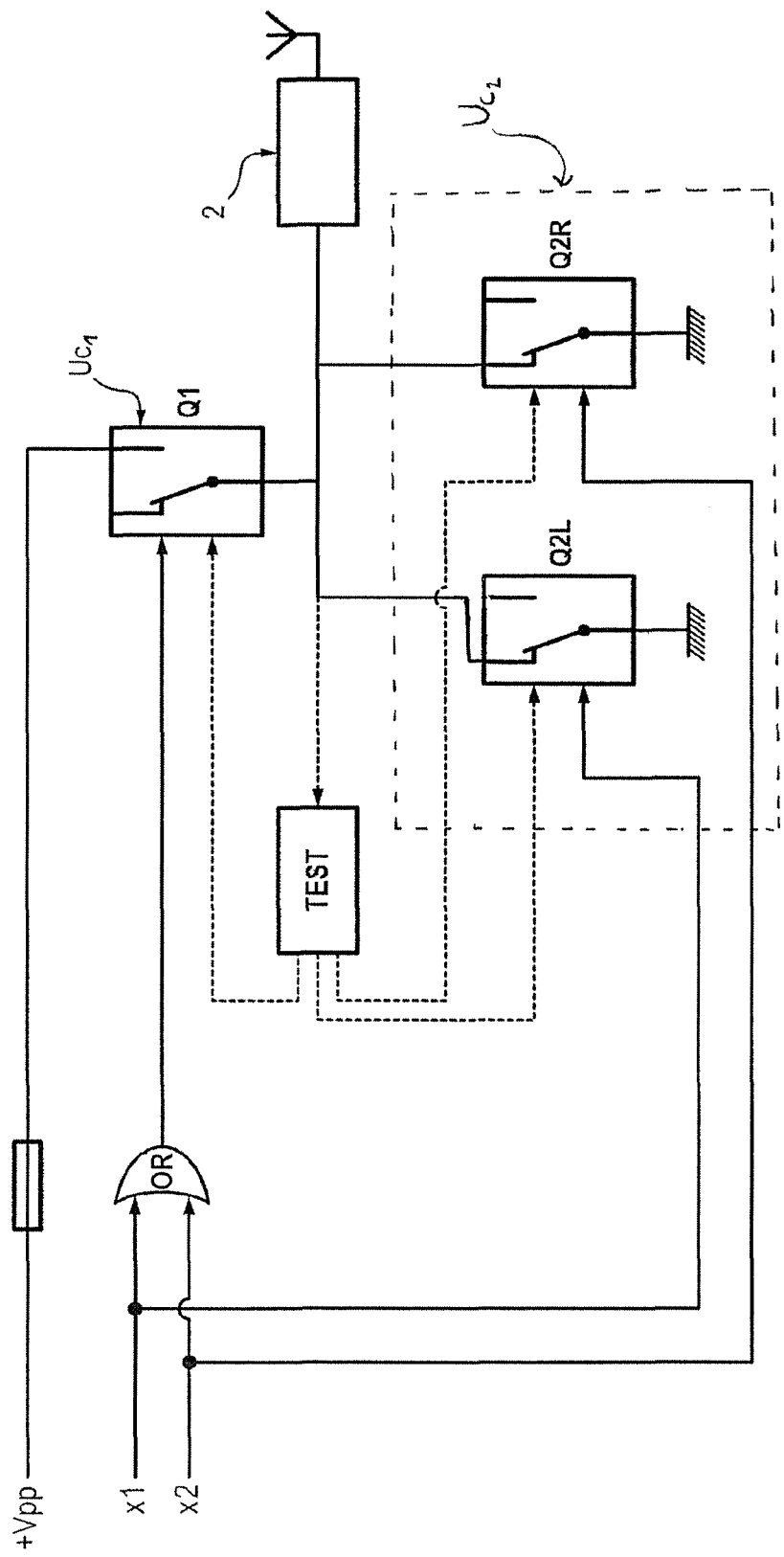
FIG. 2 illustrates a scheme diagram of an electric circuit in accordance with a first embodiment of the invention.

In relation to FIG. 2, the electric circuit 1 receives as input at least two discrete electrical signals, preferably three discrete electrical signals $x1$, $x2$ and comprises a voltage source +Vpp. The values of the discrete electrical signals determine the power of the radio module 2. In this case, in the embodiment of FIGS. 2 and 3, the discrete electrical signals must all be equal to 1 so that the radio module 2 is power supplied.

Of course, one may consider an electric circuit receiving a higher number of discrete electrical signals.

The electric circuit enables in normal operation to power supply the electrical power supply of the electrical equipment 2 according to the values of the discrete electrical signals.

We consider, in what follows, the logic values of the discrete electrical signals; in particular, we consider that a discrete electrical signal has a high state, that is to say a logical value '1' if it reflects a condition according to which the electrical equipment may be power supplied (for example, if the aircraft has landed) and it has a low state, that is to say a logical value '0' if it reflects a condition that the electrical equipment should not be power supplied.

Figure 3:
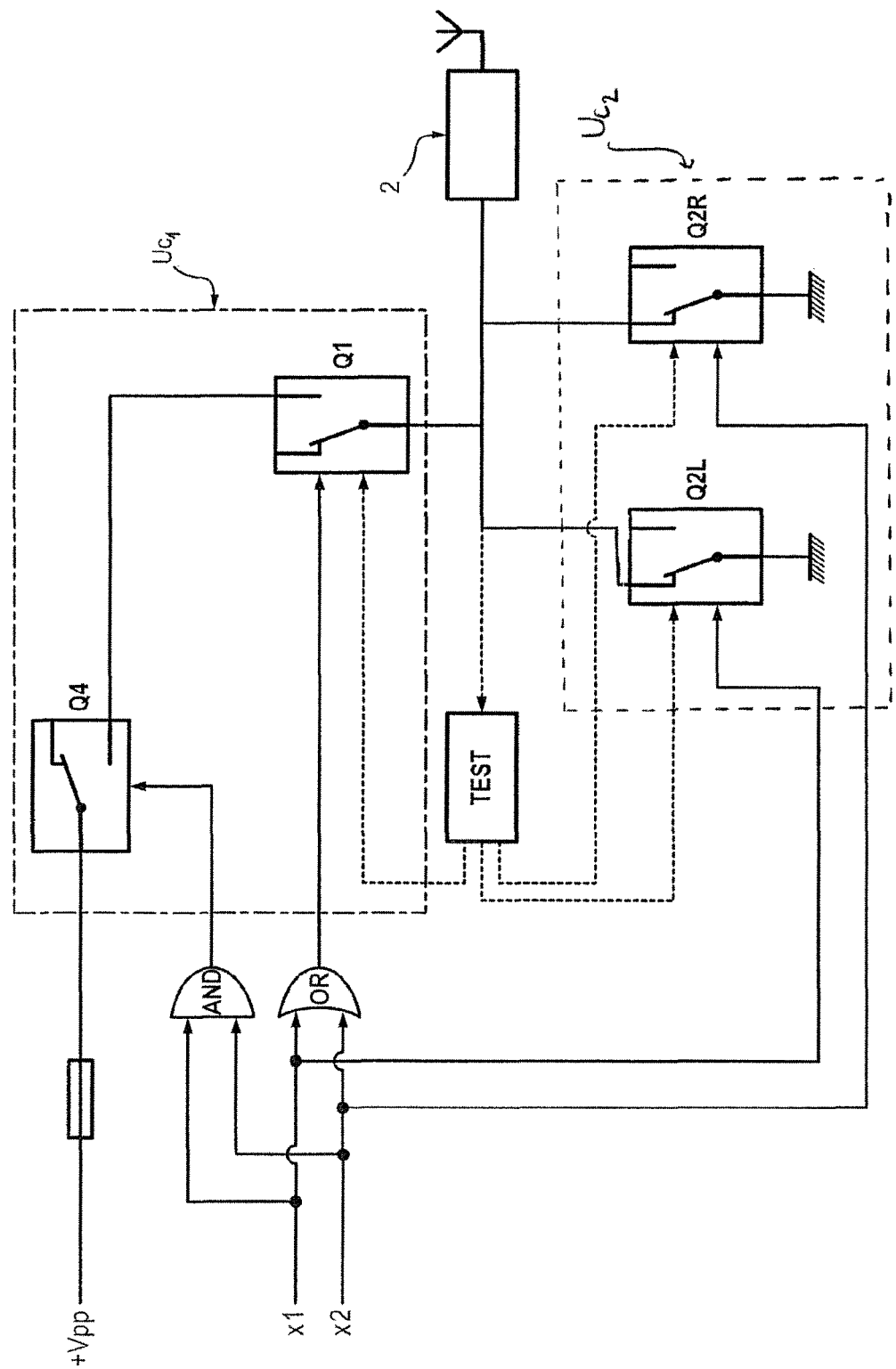
FIG. 3 illustrates a scheme diagram of an electric circuit in accordance with a second embodiment of the invention.

In relation to FIGS. 2 and 3, it is considered that the discrete electrical signals need all three to be in the high state if the electrical equipment 2 has to be power supplied.

As it will be described below, if a single component is used to test the values of the discrete signals, this latter has a probability of failure which is not negligible so that the electrical equipment is power supplied when it should be not.

To overcome this problem, the circuit has several stages that interact with each other. At each stage, we can prevent a component failure that has an inconsistent state with the discrete signals.

This reduces the probability to power supply the electrical equipment when it should not be.

Indeed, the probability of the circuit failure should be around $10^{-9}$ whereas an electronic component has a probability of failure around $10^{-6}$.

The circuit logic 1 includes a +Vpp voltage source which power supplies the electrical equipment if all discrete signals indicate that the electrical equipment should be power supplied. For example, the aircraft has landed, the discrete signals $x1$, $x2$ are both equal to '1' and are equal to '0' if this is not the case.

A first cut-off unit Uc1 is connected to the +Vpp voltage source and has an open state if the discrete electrical signals indicate that the electrical equipment should not be power supplied and a closed state if the discrete electrical signals indicate that the electrical equipment should be.

A second cut-off unit Uc2 is connected to the intersection between the electrical equipment 2 and the first cut-off unit Uc1, and a ground line. The second cut-off unit Uc2 has a complementary state to the first cut-off unit Uc1 if the discrete electrical signals $x1$, $x2$ have an identical state. The second cut-off unit Uc2 is connected to a ground line.

However, once the discrete signals $x1$, $x2$ have a divergent state, the first and second cut-off units are controlled to generate a short-circuit.

In particular, the first cut-off unit Uc1, in case of divergence of discrete electrical signals is in a closed state and the second cut-off unit Uc2 will generate the short-circuit.

Advantageously, the first cut-off unit UC1 comprises a first switch Q1 having an open or closed state depending on an electric control signal based on discrete electrical signals. The first switch Q1 is in the open state if the electric control signal has a "low" state and is in the closed state if the electric control signal has a "high" state.

The first switch Q1 is controlled by a particular logical function of discrete signals of the type 'OR' logic.

Furthermore, the second cut-off unit Uc2 comprises a parallel arrangement of at least two switches Q2L, Q2R, the parallel arrangement being connected to the power source, the state of each of the two switches is a function of a discrete electrical signal $x1$, $x2$. We note that the second cut-off unit Uc2 comprises as many switches as discrete electrical signals $x1$, $x2$.

Figure 4:
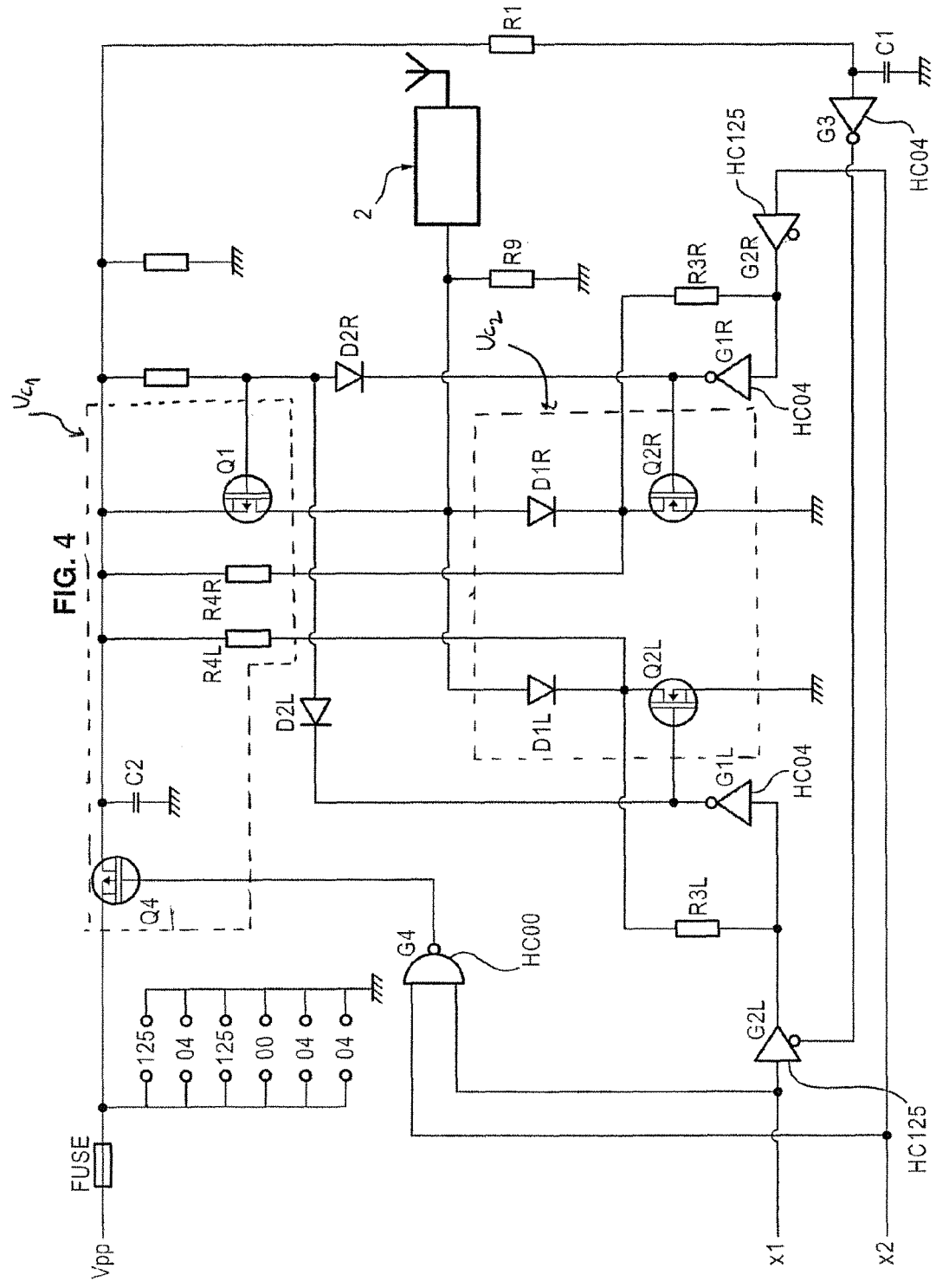
FIG. 4 illustrates a scheme diagram of an electric circuit in accordance with one embodiment of the invention.

Each switch Q2L, Q2R is respectively controlled by an inputted discrete electrical signal. Thus, in connection with FIGS. 2 to 4, the discrete electrical signal $x1$ controls the switch Q2L and the discrete electrical signal $x2$ controls the switch Q2R.

In addition, switches Q2L, Q2R are in the same state when the discrete electrical signals $x1$, $x2$ are in the same state, and the first and second cut-off units are controlled to generate a short-circuit in case of discrepancy between the discrete electrical signals x1, x2, at least two switches of the second cut-off unit have divergent states in relation to each other so as to generate the short-circuit, the first cut-off unit UC1 being in a closed state to let pass the voltage coming from the voltage source.

In a complementary way (see FIG. 3), the first cut-off unit Uc1 further comprises a second switch Q4 controlled by a logical function of discrete electrical signals of the type "AND" logic.

Finally, the electric circuit also comprises a fuse FUSE to isolate, in case of a short-circuit, the +Vpp voltage source from the elements of the logic circuit 1. In case of short-circuit the +Vpp fuse begins to melt in order to protect the circuit.

Thus, in the embodiment of FIG. 2, we have for example:
If x1=x2='0': the switch Q1 is open, both switches Q2R, Q2L are closed. There is no short-circuit, the electrical equipment is not power supplied.
If x1=x2='1': the switch Q1 is closed, the two switches Q2R, Q2L are open. The electrical equipment is power supplied.
If x1='0' and x2='1' or x1='1' and x2='0': there is a divergence between the discrete electrical signals, the switch Q1 is closed, and either the Q2L or the Q2R switch is closed. There is then a short-circuit.

In addition, in the event of failure of the switch Q1 that can be closed when it should be open (considering discrete electrical signals x1, x2), the second cut-off unit will cause a short-circuit, the electrical equipment will not be power supplied. Thus, as the second cut-off unit Uc2 enables to monitor the power supply circuit, this is also the case if the first cut-off unit Uc1 includes a second switch Q4.

Furthermore, insofar as it is unlikely that all components of the circuit have at the same time a failure, the circuit thus prevents the failures of logic components generating the controls of the various elements of the circuit.

In the embodiment of FIG. 3, we have for example:
If x1=x2='0': the switch Q4 is open, the switch Q1 is open, the two switches Q2R, Q2L are closed. There is no short-circuit, the electrical equipment is not power supplied.
If x1=x2='1': the switch Q4 is closed, the switch Q1 is closed, both switches Q2R and Q2L are open. The electrical equipment is power supplied.
If x1='0' and x2='1' or x1='1' and x2='0': there is a divergence between the discrete electrical signals, the switch Q4 is closed, the switch Q1 is closed and one or the other of the switches Q2L or Q2R is closed. There is then a short-circuit.

In a complementary manner, the electric circuit includes a test unit TEST which enables to verify the ability of the circuit to cause a short-circuit. This check can be scheduled to be run periodically when the electrical equipment 2 is not power supplied.

In particular, the test unit TEST can detect a failure of at least one component of the circuit and optionally control the first and second cut-off units to generate a short-circuit.

Regarding the second cut-off unit Uc2, the test unit is particularly adapted to implement the steps of:
isolating the electrical equipment of the electric circuit;
controlling the second cut-off unit Uc2 so that the latter is in the closed state;
measuring a voltage between the first cut-off unit and the second cut-off unit in order to verify that the second cut-off unit is adapted to generate a short-circuit, a zero voltage indicating that the second cut-off unit is operating.

Regarding the first cut-off unit Uc1, the test unit is particularly adapted to implement the steps of:
controlling the first cut-off unit Uc1 for the latter to be in the closed state;
measuring a voltage at the terminals of the second cut-off unit Uc2, a voltage equal to the voltage supplied by the +Vpp voltage source indicating that the first cut-off unit is operating;
controlling the first cut-off unit Uc1 for the latter is in the open state;
measuring a voltage at the terminals of the second cut-off unit Uc2, a zero voltage indicating that the first cut-off unit is operating.

At last, regarding one or the other of the two cut-off units, if a failure is detected at the end of the tests, we can then monitor a short-circuit.

According to one embodiment, the test unit TEST may be implemented using programmable logic components (Electronically Programmable Logic Devices, (EPLD)) or by using microcontrollers which can integrate ways of measures of analog voltages to enrich the circuit supervision level. In relation to FIG. 4 an electric circuit according to a particular embodiment is illustrated.

To generate the controls of the switches Q2L and Q2R, the electric circuit 1 includes five logic units G3, G1L, G1R, G2R, G2L.

The logic units G1L and G2L are related the switch Q2L, the logic units G1R and G2R are related to the switch Q2R, the logic unit G3 being common to the switches Q2R and Q2L.

The units G2R, G3, G2L are TriState (logic gates with three states).

The logic unit G4 is a logic gate AND.

Of course, we can consider other ways to generate the controls of the circuit.

In this embodiment, the switches Q1 and Q4 are CMOS transistors in the closed state when the control is a logic '0'.

The switches Q2L and Q2R are CMOS transistors in the closed state when the control is logic '1'.

The invention claimed is:

1. An electric circuit adapted to cut-off a power supply of an electrical equipment (2), said electric circuit receiving as input at least two discrete electrical signals (x1, x2) which values determine the power supply of the electrical equipment (2), the discrete electrical signals having a high state ('1') if the electrical equipment is to be power supplied,
the electric circuit comprising a voltage source (+Vpp);
a first cut-off unit (Uc1) connected between the electrical equipment (2) and the voltage source (+Vpp), the first cut-off unit (Uc1) having an open or closed state based on discrete electrical signals (x1, x2),
a second cut-off unit (Uc2) connected to the intersection of the electrical equipment and the first cut-off unit (Uc1), and a ground line, the second cut-off unit (Uc2) having a state complementary to the state of the first cut-off unit if the discrete electrical signals (x1, x2) are in a same state,
the second cut-off unit (Uc2) comprising a parallel circuit of at least two switches (Q2L, Q2R), said parallel circuit being connected to the power source, wherein the state of each of the two switches is a function of athe discrete electrical signals (x1, x2),
the two switches are in the same state when the discrete electrical signals (x1, x2) are in the same state, and in case of a discrepancy between the state of the discrete electrical signals, the first and second cut-off units generate a short-circuit by the at least two switches of the second cut-off unit having divergent states one from another.

2. The electric circuit according to claim 1, wherein the second cut-off unit (Uc2) comprises as many switches as discrete electrical signals.

3. The electric circuit according to claim 2, wherein the switches of the parallel arrangement have an open or closed state depending on an electric control signal, the switches being in the open state if the electric control signal has a "high" state and in the closed state if the electric control signal has a "low" state.

4. The electric circuit according to claim 1, wherein the first cut-off unit comprises a first switch (Q1) having an open or closed state depending on an electric control signal based on discrete electrical signals, the first switch being in the open state if the electric control signal has a "low" state and is in the closed state if the electric control signal has a "high" state.

5. The electric circuit according to claim 4, wherein the first switch is controlled by a logical function of the discrete electric signals of logic type 'OR'.

6. The electric circuit according to claim 4 or claim 5, wherein the first cut-off unit (Uc1) comprises a second switch (Q4), the second switch having an open or closed state depending on the electric control signal based on discrete electrical signals, the second switch being in the open state if the electric control signal has a "down" state and is in the closed state if the electric control signal has a "high" state, the said second switch (Q4) being adapted to isolate the voltage source from the power supply if the discrete electrical signals are in the low state.

7. The electric circuit according to claim 6, wherein the second switch (Q4) is controlled by a logical function of discrete electrical signals of the type logic 'AND'.

8. The electric circuit according to claim 1, comprising at least one fuse (FUSE) for isolating, in case of short-circuit, the voltage source (+Vpp) of the elements of said electric circuit.

9. The electric circuit according to claim 1, comprising a test unit (TEST) for detecting a failure of at least one component of the circuit and selectively controlling the first and second cut-off units to generate a short-circuit.

10. The electric circuit according to claim 9, wherein the test unit is adapted to implement the steps of:
    isolating the electrical equipment of the electric circuit;
    controlling the second cut-off unit (Uc2) so that the second cut-off unit is in the closed state;
    measuring a voltage between the first cut-off unit and the second cut-off unit to verify that the second cut-off unit is adapted to generate a short-circuit.

11. The electric circuit according to claim 9 or claim 10, wherein the test unit (TEST) is adapted to implement the steps of:
    controlling the first cut-off unit (Uc1) to be in the closed state;
    measuring a voltage at the terminals of the second cut-off unit (Uc2), a voltage equal to the voltage supplied by the voltage source (+Vpp) indicating that the first cut-off unit is operating;
    controlling the first cut-off unit (Uc1) to be in the open state;
    measuring a voltage at the terminals of the second cut-off unit (Uc1), a zero voltage indicating that the first cut-off unit is operating.

12. The electric circuit according to claim 9 or claim 10, wherein the test unit (TEST) is implemented using programmable logic components or using microcontrollers which can incorporate means of analog voltage measurements for enriching the circuit supervision level.

13. An avionic data acquisition, processing and communication system comprising a radio module (2) connected to an electric circuit according to claim 1.

* * * * *